United States Patent [19]
Kato et al.

[11] Patent Number: 4,901,325
[45] Date of Patent: Feb. 13, 1990

[54] SEMICONDUCTOR LASER DEVICE

[75] Inventors: Takeshi Kato, Kokubunji; Kenichi Mizuishi, Hachioji; Katuaki Chiba, Akigawa; Takeshi Nakao, Sagamihara; Masahiro Ojima, Tokyo; Shigeru Nakamura, Tachikawa; Takeshi Maeda, Kokubunji, all of Japan

[73] Assignee: Hitachi, Ltd., Tokyo, Japan

[21] Appl. No.: 173,658

[22] Filed: Mar. 25, 1988

[30] Foreign Application Priority Data

Mar. 26, 1987 [JP] Japan .................................. 62-70268
Sep. 11, 1987 [JP] Japan ................................ 62-226339

[51] Int. Cl.⁴ ............................................... H01S 3/19
[52] U.S. Cl. ........................................ 372/44; 372/23; 357/74
[58] Field of Search ................................. 372/43–44, 372/50, 36, 97, 23, 33; 357/74

[56] References Cited

U.S. PATENT DOCUMENTS

| | | | |
|---|---|---|---|
| 3,396,344 | 8/1968 | Broom | 372/36 |
| 4,403,243 | 9/1983 | Hakamada | 357/74 |
| 4,686,678 | 8/1987 | Ohta et al. | 357/74 |

FOREIGN PATENT DOCUMENTS

| | | | |
|---|---|---|---|
| 0063309 | 10/1982 | European Pat. Off. | 372/50 |
| 0071289 | 9/1985 | Japan | 372/43 |
| 0196446 | 8/1986 | Japan . | |
| 0231789 | 10/1986 | Japan | 372/50 |

OTHER PUBLICATIONS

Kitano et al., *Hitachi Review*, vol. 33, No. 3, 1984, "Large-Capacity Optical Disk Files," pp. 109–114.
Extended Abstracts in the 47th Convention of the Japan Society of Applied Physics, 27p-T-10, 11, p. 159 (1986).

*Primary Examiner*—Frank Gonzalez
*Attorney, Agent, or Firm*—Antonelli, Terry & Wands

[57] ABSTRACT

A semiconductor laser device utilizing at least a pair of semiconductor laser chips; and a fixing device for fixing the semiconductor laser chips so that electrode surfaces are approximately parallel and opposite to each other and the interval between light emitting spots of the semiconductor laser chips is small.

19 Claims, 9 Drawing Sheets

SEMICONDUCTOR LASER DEVICE

BACKGROUND OF THE INVENTION

This invention relates to a semiconductor laser device consisting of a plurality of independent semiconductor laser chips emitting laser beams, which are close to each other, a method for fabricating same and an optical head using the same.

At the present time, research for the purpose of increasing the speed and improving characteristics of optical disk devices and laser beam purities is actively advancing. Concerning the optical disk devices, several methods for realizing an error check function just after the recording using a plurality of light spots, a recording/reproducing/erasing function or a parallel processing function capable of recording/reproducing simultaneously 2 tracks are known (cf. e.g. JP-A-61-196446). Further, for a laser beam printer, it is intended to increase the recording speed similarly by using a plurality of light spots. As a measure for realizing the methods described above, utilization of a semiconductor laser array has been studied. There are two types of prior art semiconductor laser devices in which the semiconductor laser arrays stated above are mounted, monolithic type and hybrid type, as described e.g. in the preliminary reports of the 47th Meeting of the Applied Physical Society of Japan, 27 p-T-10, 11, p. 159 (1986). In a monolithic type device a plurality of laser elements are arranged in the form of an array on a semiconductor laser chip, for which the lower limit of the interval between adjacent light emitting spots is usually about 100 μm.

In a hybrid type device a plurality of semiconductor laser chips are arranged in parallel on a mounting plane, for which the lower limit of the interval between adjacent light emitting spots is usually about 150 μm.

Further, in the prior art semiconductor laser devices of both types, the oscillation wavelength of a plurality of semiconductor laser elements or chips included in the devices was uniform.

In optical disk devices and laser beam printers it is required that the interval between collected light spots of a plurality of focussed laser light beams be several μm to several tens of μm. Therefore it is desirable that the interval of light emitting spots in the semiconductor laser device be smaller than 100 μm, although it depends on the image magnification of the focussing optical system used in the optical disk device or the laser beam printer. This is because the effective visual field of the optical lens system relating to the semiconductor laser device stated above is limited and it is necessary to use the lens system in its paraxial region where there are no aberrations. This requirement becomes more severe, when an attempt is made to make the optical lens system smaller.

For the prior art monolithic type semiconductor laser arrays, when the interval between light emitting spots, i.e. the array interval of semiconductor laser elements is reduced to a value below 100 μm, and the elements interfere thermally and electrically with each other, which makes it difficult to modulate their output independently. Consequently, in order to reduce the interval between light emitting spots to a value below 100 μm, a problem, which is serious from the technical point of view, needed to be overcome.

On the other hand, for the prior art hybrid type semiconductor laser arrays, where a plurality of laser devices are arranged in parallel on a plane, since it is necessary to cut laser chips at the extreme proximity of the laser active region, deteriorations due to distortions in the laser chips are produced which gives rise to a problem that the laser life is shortened. Consequently it is impossible to reduce the interval between light emitting spots to a value below 100 μm.

However, in order to effect recording and reproduction in real time in an optical disk device without waiting time for rotation of the disk, at least 2 semiconductor lasers are necessary, one having a high output for writing and erasing and another having low noise characteristics for reproduction. Further, when the semiconductor lasers have the same wavelength, it is necessary to separate spatially the beams in the signal detecting system, which complicates the optical system. This is disadvantageous from the point of view of reducing the size and lowering the cost. On the other hand, for the monolithic type it is extremely difficult from the point of view of the semiconductor production process to arrange laser elements having different wavelengths, outputs and noise characteristics in the form of an array.

The interval $l$ between adjacent spots in an optical disk device using a semiconductor laser device as an optical head is determined by the distance d between laser diodes, the numerical aperture $NA_c$ of the collimating lens and the numerical aperture $NA_f$ of the focusing lens as follows:

$$l = d \cdot \frac{NA_c}{NA_f}$$

In order to collect efficiently the beam emitted by the semiconductor laser device so as to achieve recording or erasing, usually a collimating lens having an $NA_c$, which is greater than e.g. 0.2 is used. For the optical head for recording, a focusing lens having an $NA_f$ which is e.g. 0.5 is frequently used. Therefore, for an optical head using a monolithic type semiconductor laser array and described as an example of the prior art techniques the interval $l$ between spots is greater than 40 μm, when $d \geq 100$ μm, $NA_c \geq 0.2$ and $NA_f = 0.5$. When the interval between spots on a surface of the disk is 40 μm, deviation of the track in the optical disk device is about 0.13 μm, which exceeds the tolerable track deviation.

SUMMARY OF THE INVENTION

An object of this invention is to provide a semiconductor laser device, in which a plurality of semiconductor laser elements having different characteristics are mounted and the interval between light emitting spots of the semiconductor laser elements described above can be reduced to a value below 100 μm.

Another object of this invention is to provide a semiconductor laser device which is capable of applying different multiple laser beams to a certain portion without chromatic aberration.

Another object of this invention is to provide a method for fabricating a semiconductor laser device, by which it is possible to arrange semiconductor laser elements at their predetermined positions with an interval between light emitting spots below 100 μm.

Still another object of this invention is to provide a 2-beam optical head capable of reducing the interval between 2 adjacent spots on a surface of the disk to a value below 40 μm and more advantageously below 20

μm. It provides further a 2-beam optical head, by means of which it is easy to separate the 2 beams from each other and to reduce the thickness thereof.

These objects can be achieved by adopting a mounting structure, by which two semiconductor laser chips are fixed separately from each other on two surfaces, which are opposite to each other at an interval of a space, in a hybrid type semiconductor laser device.

According to the above measures for resolving the object it is possible to locate active regions of 2 semiconductor laser chips close to each other at an interval of a small space. That is, by fixing separately 2 semiconductor laser chips on two surfaces, which are opposite to each other at an interval of a space, in a hybrid type semiconductor laser device, it is possible to reduce the interval between light emitting spots of the semiconductor laser chips to a length, which is about twice as great as the distance between the electrode and the active region without adding any special processing to a prior art semiconductor laser chip and thus an interval below 100 μm can be easily realized. Further, since it is of hybrid type it is possible to mount semiconductor laser chips having different characteristics. In addition, since the above semiconductor laser chips are mounted at separate locations independently from each other in the device, the laser chips interfere neither thermally nor electrically with each other and thus it is possible to modulate independently the laser chips.

By the method for fabricating the semiconductor laser device according to this invention the semiconductor laser chips are positioned and held separately, and mounted by securing them to a base plate. In this case it is desirable to mount each of the semiconductor laser chips on a supporter and to fix this supporter to a base plate through an adhesive layer.

In an optical head according to this invention two semiconductor laser chips are disposed opposite to each and two laser beams emitted by these two semiconductor laser chips are focused to two spots on a surface of a disk by a common lens system. Further the two semiconductor laser chips have different wavelengths. In addition a half wave plate is disposed between the laser chips and a beam splitter.

By disposing two semiconductor laser chips opposite to each other it is possible to reduce the distance between two light emitting points to about 10 μm. According to the example described above, supposing that the numerical aperture of the focusing lens $NA_f$ is 0.5, $NA_c$ of the collimator lens is 0.2, and the distance d between light emitting points of 2 semiconductor laser chips is 10 μm, the interval l between spots on the surface of the disk is 4 μm. Thus it is amply possible to achieve a spot interval below 40 μm and further below 20 μm.

Furthermore, when semiconductor laser chips have different wavelengths, it is possible to separate easily the two beams by means of a wavelength separating prism, etc. In addition it is also possible to reduce the thickness of the optical head, because a half wave plate can transform the polarization direction of the beams emitted by the semiconductor laser chips into a direction in the plane of the optical head, which makes it possible to arrange optical parts in a same plane.

DESCRIPTION OF THE PREFERRED EMBODIMENT

Figure 1A:
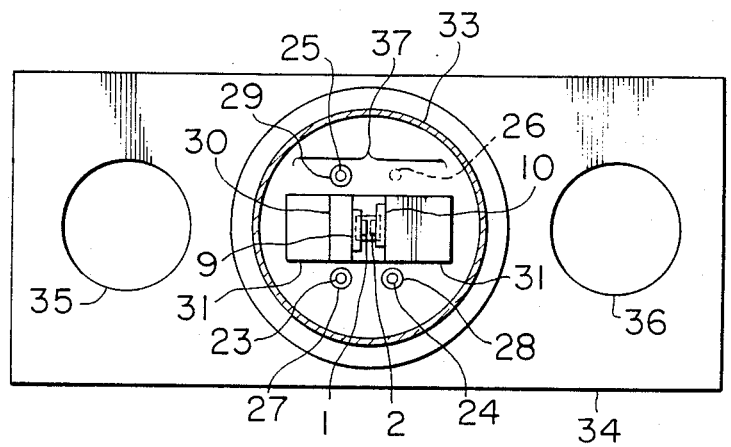
FIG. 1A is a plan view illustrating a first embodiment of the semiconductor laser device according to this invention.

The embodiments of this invention will be explained below, referring to the drawings.

Figure 1B:
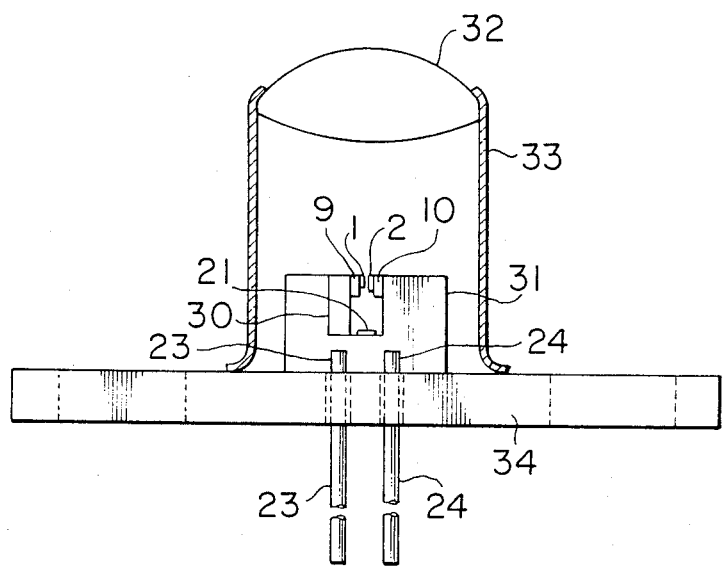
FIG. 1B is a side view of the device indicated in FIG. 1A.
Figure 2A:
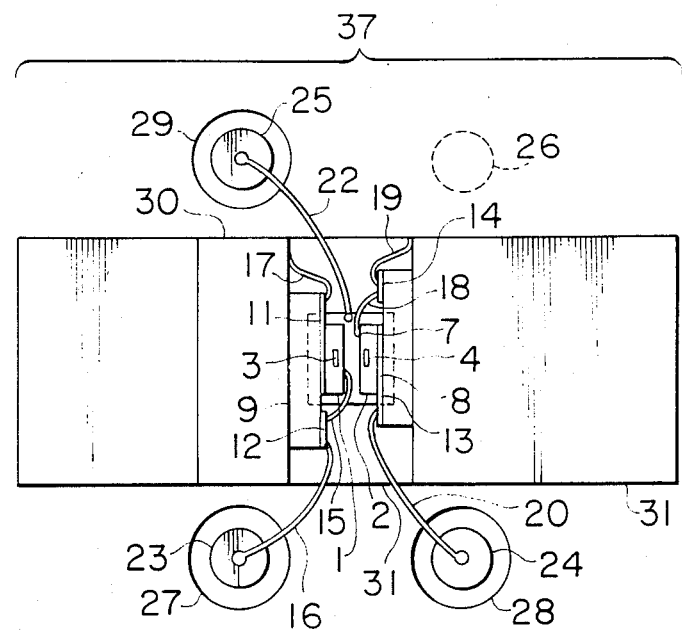
FIG. 2A is a plan view of an enlarged central portion of the device indicated in FIG. 1A.
Figure 2B:
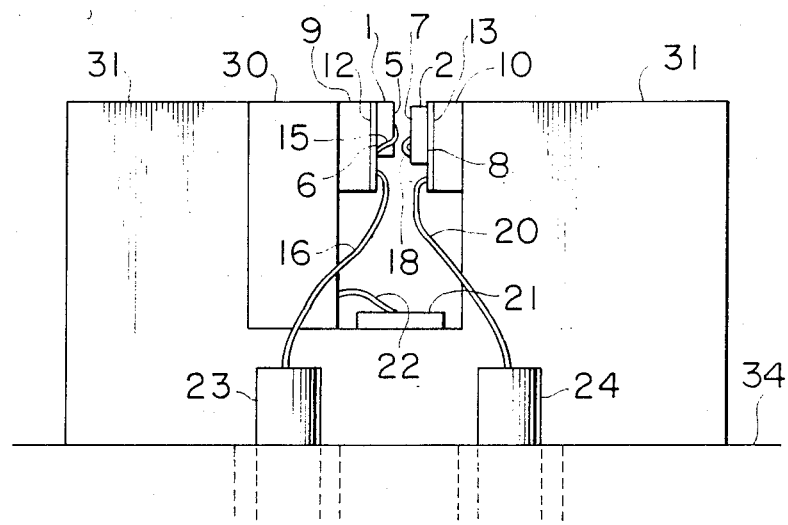
FIG. 2B is a side view corresponding to FIG. 2A.

FIG. 1A is a plan view illustrating a first embodiment of the semiconductor laser device according to this invention; FIG. 1B is a side view of the device indicated in FIG. 1A; FIG. 2A is a plan view of an enlarged central portion of the device indicated in FIG. 1A; and FIG. 2B is a side view corresponding to FIG. 2A.

The first embodiment indicated in FIGS. 1A and 1B is a semiconductor laser device used for an optical disk device. In FIGS. 1A to 2B semiconductor laser chips 1 and 2 are mounted on submounts 9 and 10. In turn the submount 9 is mounted on a block 31 through a mount 30 and the submount 10 is mounted directly on the block 31. Further a photodiode 21 for the laser light mounting is mounted also on the block 31. Terminals 23, 24 and 25 are hermetically joined to a base plate 34 through glass seals 27, 28 and 29, respectively. A block 31, a cap 33, in which a lens 32 is inserted, and a terminal 26 are welded to the base plate 34. Threaded holes 35 and 36 are formed in the base plate 34. The central portion 37 including the block 31, the terminals 23, 24, 25 and 26 described above is hermetically sealed by the cap 33 and the base plate 34.

The semiconductor laser chip 1 is a semiconductor laser made of AlGaAs having an oscillation wavelength of 780 nm, which has low noise characteristics and is used for reproduction of optical disks. A laser light beam is emitted by an active region 3 indicated in FIG. 2A. An electrode 5 is on the n side of the laser chip 1 and the other electrode 6 is on the p side. The distance between a surface of the electrode 5 and the active region 3 is about 5 μm.

On the other hand the semiconductor laser chip 2 is a semiconductor laser made of AlGaAs having an oscillation wavelength of 830 nm, which has high output characteristics and is used for writing and erasing of optical disks. An electrode 7 is on the p side of the semiconductor laser chip 2 and the other electrode 8 is on the n side. A laser light beam is emitted by an active region 4, which is apart by about 5 μm from an electrode surface 7.

The submounts 9 and 10 are made of SiC ceramics and the surfaces thereof are partly metallized by using Au/Ni/Ti for electric wiring. (Metallized portions are designated by 11, 12, 13 and 14.)

The photodiode 21 is an Si PIN photodiode having a wavelength band of 0.8 μm. The upper surface thereof is the light receiving surface, which monitors the light power of the laser light beams emitted by the semiconductor laser chips 1 and 2 by time-sharing as described below.

Since the emission angle of the laser light is as wide as 10°–40° and light entering the photodiode 21 comes from both semiconductor laser chips, the 2 laser lights cannot be separated spatially. Consequently it is not possible to monitor the light power of each of the laser lights independently, as they are. Therefore the light power of each of the laser lights is monitored separately in time and independently by means of one photodiode by making the semiconductor laser chips oscillate alternately so that only one of them oscillate in a certain time region. For example, in the case of a code data recording optical disk for a computer, the period of time during which the light spot runs on an alternative sector which is disposed for every track, or an alternative track which is disposed for several tracks, or in the case of a video optical disk a retrace time of a vertical synchronization, which is disposed for every turn of track, can be used as the time region for monitoring the power of the laser lights. During this time region, at first one of the semiconductor laser chips is made to oscillate and the light power is monitored. Then, the other semiconductor laser chip is made to oscillate and the light power is monitored. In this way it is possible to monitor independently the light power of each of the laser lights by time-sharing.

The terminals 23, 24, 25 and 26, the mount 30, the block 31, the cap 33 and the base plate 34 are made of e.g. Kovar (Ni-Co-Fe alloy) or Cu and the surface thereof is metallized by Au/Ni. The lens 32 is e.g. a dual surface aspheric glass lens. Depending on beam characteristics of the laser lights or the specification of the optical system, the surfaces of the lens 32 may be shaped to an ellipsoid, a paraboloid or a hyperboloid which is rotationally symmetric, or a superficial form having radii of curvature which are rotationally asymmetric, or a combination thereof. The laser lights emitted by the semiconductor laser chips 1 and 2 are transformed by the lens 32 described above into uniform parallel beams whose spherical aberrations are corrected, which quit the semiconductor laser device. In the case where it is not necessary to transform the laser lights into parallel beams or where an optical system for transforming them into parallel beams is disposed separately, it is a matter of course that it is not necessary to dispose the lens 32 described above.

All the joints between the semiconductor laser chips 1 and 2 and the submount 9 and 10, respectively, the submount 9 and the mount 30 the submount 10 and the block 31, the mount 30 and the block 31 as well as the photodiode 21 and the block 31 were effected by soldering. Depending on the mounting process solders having different melting points, e.g. Au-Sn, Pb-Sn, In-Sn alloys, were used.

Electric wiring for the semiconductor laser chips 1 and 2 was effected as follows. The electrode 5 is connected through a wire 15 with the metallized surface 12, which in turn is connected through a wire 16 with the terminal 23. The electrode 6 is grounded through the metallized surface 11 and a wire 17 and further through the mount 30, the block 31 and the base plate 34 at the terminal 26. The electrode 7 is grounded through a wire 18, the metallized surface 14, a wire 19, the block 31 and the base plate 34 at the terminal 26. The electrode 8 is connected through the metallized surface 13 and a wire 20 with the terminal 24. The light receiving side of the photodiode 21 is connected through a wire 22 with the terminal 25 and the opposite side is grounded through the block 31 and the base plate 34 at the terminal 26. All the wires 15, 16, 17, 18, 19, 20 and 22 are made of Au.

Now the outline of the mounting process of this semiconductor laser device will be explained. At first the photodiode 21 is secured at a predetermined position to the block 31 by using Au-Sn solder. Then the semiconductor laser chips 1 and 2 are secured to the submounts 9 and 10, respectively, by using Au-Sn solder. The submount 9 is secured at a predetermined position to the mount 30 and the submount 10 is secured at a predetermined position to the block 31 by using Pb-Sn solder. Thereafter the mount 30 is fixed by using In-Sn solder after having regulated the position of the active region 3 with respect to the active region 4 while moving it transversely, keeping it closely to the block 31. The block 31 may be welded to the base plate 34 either after the termination of the processes described above or previously before them. Other kinds of solder may be used, depending on the order of the processes, the specification of the semiconductor laser device concerning the heat resistivity, etc.

The position, where the semiconductor laser chip 2 is mounted, is shifted backward by several to several tens of μm in the direction of the emission of the laser light with respect to the position, where the semiconductor laser chip 1 is mounted. This is for the purpose of correcting the chromatic aberration due to the fact that the refractive index of the glass, of which the lens 32 is made, is different for the wavelengths of the lights emitted by the laser chips 1 and 2. The distance, over which it is to be shifted, is approximately proportional to the difference between the wavelengths of the lights emitted by the semiconductor laser chips 1 and 2, because the difference between the refractive indices of the lens 32 is approximately proportional to the difference between the wavelengths. If the semiconductor lasers chip 2 is previously shifted in the mounting process, when it is mounted on the submount 10, it is sufficient to mount thereafter the semiconductor laser chip 1, the submounts 9 and 10, the mount 30 and the block 31 while truing up the upper surfaces thereof in a same level.

By using the optical head for optical disks according to this embodiment low noise reproduction as well as high output writing and erasing can be effected in real time. In addition it is possible to reduce the size of the optical head, because a common optical system may be used for both semiconductor laser chips.

In addition, as indicated by this embodiment, when a pair of semiconductor laser chips 1 and 2 are fixed separately on two surfaces 11 and 13, respectively, which are opposite to each other at an interval of a space, so that the surfaces of the electrodes 5 and 7 are approximately parallel to each other and further they are opposite to each other, it is possible to reduce easily the distance between the two active regions 3 and 4, i.e. the interval between the light emitting spots, to a value below 50 μm. Consequently, since a small size lens, whose effective field of vision is smaller, can be used, it is possible to reduce further the size of the optical head. Here, even if the interval between the light emitting spots is reduce to 50 μm, since the semiconductor laser chips 1 and 2 are completely separated electrically from each other and since they are mounted at positions distant from each other on the U-shaped block 31, the laser chips 1 and 2 interfere with each other neither electrically nor thermally and consequently it is not necessary to take additional measures against the interference, contrast to the prior art semiconductor laser device.

Furthermore, since the oscillation wavelengths of the two semiconductor laser chips 1 and 2 are different, it is possible to effect simply the signal separation of the two laser beams in the signal detection system only by separating the wavelengths by means of an optical wavelength filter. For this reason it is possible to omit the complicated optical system, which is necessary in the case where the oscillation wavelengths are equal.

As explained above, according to this embodiment, it is possible to reduce the size of an optical head for optical disks by a factor greater than 2 with respect to conventional heads. In addition the actuator can be operated with a high speed owing to decrease of the weight of movable parts in the optical system and the access time to the optical disk is shortened by a factor of about 30%.

Figure 3:
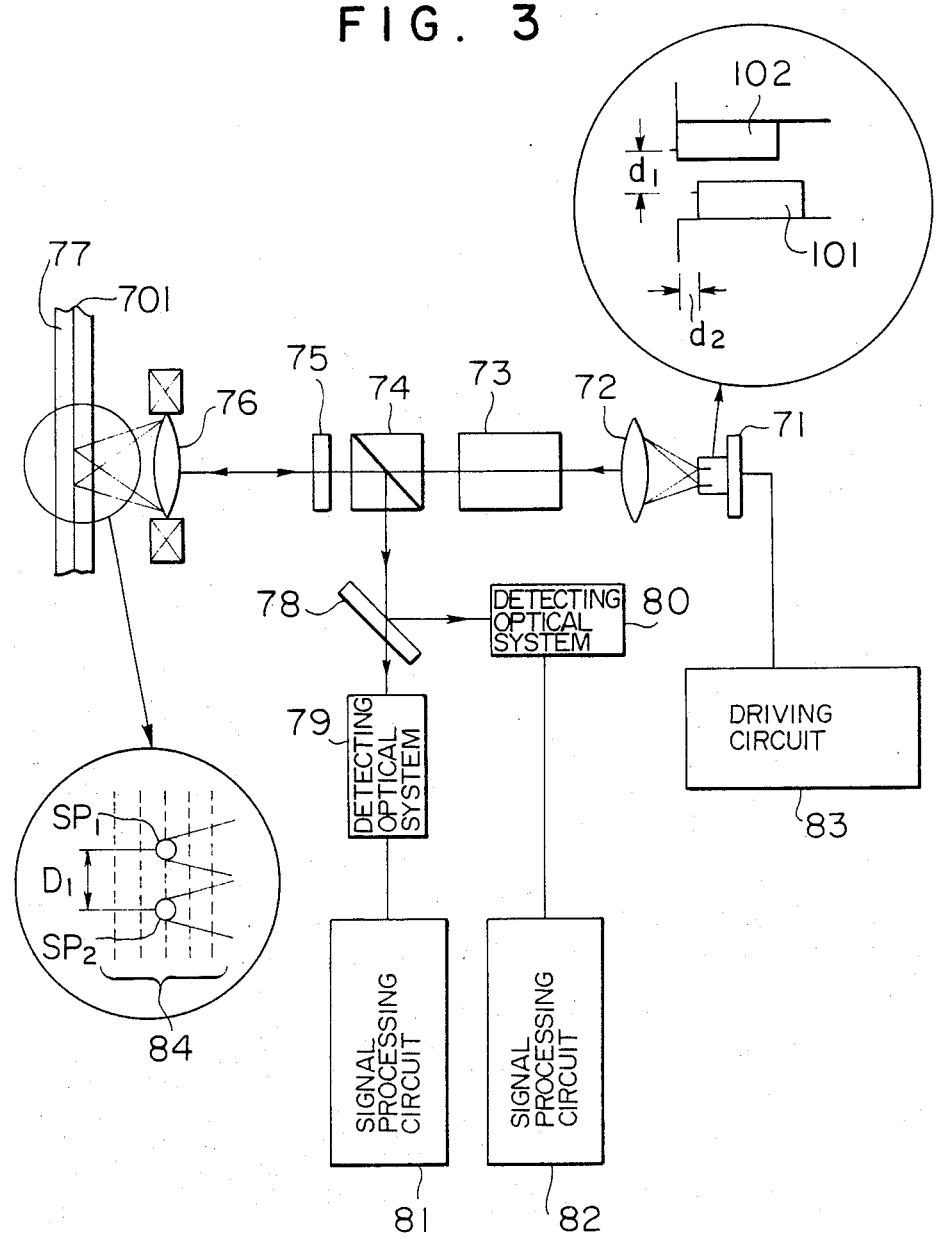
FIG. 3 is a scheme showing the construction of an example, in which the above embodiment is applied to an optical disk device.

FIG. 3 shows an example, in which this semiconductor laser device according to the first embodiment is applied to an optical disk. Two semiconductor laser chips, i.e. a laser chip 101 (hereinbelow called LD1) having an oscillation wavelength of 830 nm and a high output and a laser chip 102 (hereinbelow called LD2) having an oscillation wavelength of 780 nm and low noise characteristics, are disposed closely to each other, as indicated in the first embodiment, within a semiconductor laser device 71 (a partial enlarged scheme thereof is indicated in the circle at the right upper part of the figure). The light beams emitted by the 2 semiconductor laser chips LD1 and LD2 are transformed into parallel light beams having circular intensity distribution by passing through a collimating lens 72 and a beam forming optical system 73. (A glass plate is inserted in the cap of the semiconductor laser device 71 used here instead of the lens.) The beam forming optical system 73 may be omitted, depending on the specification. The parallel light beams pass through a beam splitter 74 and a λ/4 plate 75 and are focused by a focusing lens 76 so as to form collected light spots having a diameter of about 1 μm on a recording film 701 of an optical disk 77. The collected light spot SP$_1$ of the laser chip LD1 is advanced on a track 84 of the rotating optical disk 77 with respect to the collected light spot SP$_2$ of the laser chip LD2. SP$_1$ carries out recording of information (writing/erasing) and SP$_2$ effects reproduction and error check (a partial enlarged scheme thereof is indicated in the circle at the left lower part of the figure).

The distance D$_1$ between SP$_1$ and SP$_2$ stated above on a track 84 of the optical disk 77 can be obtained by using the distance d$_1$ between the light emitting spots of LD1 and LD2 and the lateral magnification factor m$_1$ of the focusing optical system consisting of the collimating lens 72 and the focusing lens 76. The lateral magnification factor m$_1$ of the focusing optical system is given by:

$$m_1 = f_F/f_c \quad (1)$$

where $f_c$ is the focal length of the collimating lens 72 and $f_F$ is the focal length of the focusing lens 76. Consequently the relationship between the collected light spot distance D$_1$ on the optical disk 77 and the light emitting spot distance d$_1$ of the semiconductor laser chips is represented by:

$$D_1 = m_1 d_1 = (f_F/f_c) d_1 \quad (2)$$

The specification of D$_1$ for an optical disk device is determined, taking the image field of vision of the focusing lens 76, the signal processing method, the disk format, etc. into account. In practice, in many cases, D$_1$ is set to be smaller than 50 μm, and more preferably smaller than 20 μm. Now, since the focusing optical system has a chromatic aberration, when laser lights having different wavelengths are focused by a same optical system, the focusing positions of the collected light spots SP$_1$ and SP$_2$ deviate from each other in the propagation direction of the laser lights. Since the focusing control is effected for either one of the collected light spots, the other collected light spot produces a focusing deviation. In order to prevent this focusing deviation, the semiconductor laser chips LD1 and LD2 are located previously before and behind in the direction of the laser light emission so that the light emission spots of the two laser chips deviate from each other in the direction of the optical axis. In this case, the original deviation of the focusing positions D$_2$ is given by:

$$D_2 = \Delta\lambda \cdot C \quad (3)$$

where C (μm/nm) represents the chromatic aberration of the whole focusing optical system consisting of the focusing lens 76 and the collimating lens 72 and Δλ (nm) indicates the difference between the oscillation wavelengths of LD1 and LD2. Since the axial magnification factor m$_2$ of the focusing optical system is represented by;

$$m_2 = (f_F/f_c)^2 \quad (4)$$

the magnitude of deviation d$_2$, which is necessary, between the mounting positions of LD1 and LD2 is given by:

$$d_2 = D_2/m_2 = (\Delta\lambda - C)/(f_F/f_c)^2 \quad (5)$$

In this way, when LD1 is mounted behind LD2 by d$_2$ in the direction of the laser light emission, the focusing points of LD1 and LD2 on the optical disk 77 are in accordance with each other. Here d$_2$ represents the value obtained in the case where both LD1 and LD2 have no astigmatic aberration.

In practice since the used laser chip (LD2) having an oscillation wavelength of 780 nm has an astigmatic aberration, it is necessary to correct d$_2$. Since it is thought that the light emitting point (it is assumed that it is at the center of the circle of least confusion) of LD2 is located in the interior of the laser chip by ½ of the astigmatic difference from the end surface of the laser, the magnitude of deviation d$_2'$ sented by;

$$d_2' = d_2 + (\Delta Z/2) \qquad (6)$$

where $\Delta Z$ represents the astigmatic difference of LD2. In the case where both LD1 and LD2 have astigmatic aberrations, the following equation is valid;

$$d_2'' = d_2 + (\Delta Z_S - \Delta Z_L)/2$$

where $\Delta Z_S$ represents the astigmatic difference of LD2 oscillating with the shorter wavelength and $\Delta Z_L$ that of LD1 oscillation with the longer wavelength.

Now the collected light spot interval $D_1$ and the magnitude of deviation $d_2'$ between the positions of LD1 and LD2 are calculated by using Eqs. (2) and (6). For example, when $f_F = 3.3$ mm, $f_c = 8.75$ mm, $d_1 = 50$ μm, $C = 0.05$ μm/nm, $\Delta\lambda = 830 - 780 = 50$ nm and $\Delta Z = 16$ μm, the following values are obtained;

$$D_1 = 19 \text{ μm and } d_2' = 26 \text{ μm}$$

The value of $D_1$ described above is sufficiently suitable for real time recording/reproduction of optical disks. The value of $d_2'$ described above is controllable satisfactorily in the fabrication process, by which LD1 and LD2 are fixed on the semiconductor laser device. In reality, when the optical disk device is mounted by using the numerical values stated above, the focusing positions of $SP_1$ and $SP_2$ are in accordance with each other and good collected light spot characteristics can be obtained.

The two lights reflected by the optical disk 77 and having different wavelengths are reflected by a beam splitter 74 and separated in wavelength by an optical wavelength filter 78. For example, in the case where an optical wavelength filter transmitting totally the light of $\lambda = 830$ nm and reflecting totally the light of $\lambda = 780$ nm is used, only the light of $\lambda = 830$ nm enters a detecting optical system 79 and only the light of $\lambda = 780$ nm enters another detecting optical system 80. In order to improve further the wavelength separation characteristics, measures, by which 2 wavelength optical filters 78 are used (1), or by which a filter having a wavelength separating film on each of the two surfaces is used (2), may be adopted. The output of the detecting optical system 79 enters a signal processing circuit 81 and collected light spot controlling signals for autofocusing, tracking etc., address information previously recorded on the disk, etc. can be obtained there. On the other hand the output of the detecting optical system 80 enter another signal processing circuit 82 and reproduction of recorded signals and error check are effected there. The semiconductor laser device 71 is controlled by a driving circuit 83.

At the recording, LD1 is pulse-modulated by the driving circuit 83, responding to (writing/erasing) information to be recorded. LD2 is DC-driven at a low output power and effects error check through the signal processing circuit 82 while controlling the light spot by means of the signal processing circuit 81. At the reproduction, both LD1 and LD2 are DC-driven at a low output power and reproduced signals are obtained at the signal processing circuit 82, while obtaining light spot controlling signals at the signal processing circuit 81. At the reproduction a method may be used, by which LD1 is not oscillated and both the light spot control and the reproduction are carried out only by LD2. Roles of LD1, LD2, the signal processing circuit 81 and 82 may be changed, depending on differences of the signal processing method.

In the embodiment of the optical disk device described above, the low noise laser chip used as LD2 having an oscillation wavelength of 780 nm is suitable for the signal reproduction from the point of view that it is unnecessary to use any means for harmonic wave superposition etc. On the contrary, it had heretofore a drawback that the astigmatic aberration is great. However this drawback produces no problem in the optical disk device, because it can be dealt with satisfactorily by using a numerical aperture of the collimating lens 72, which is smaller than e.g. 0.2.

The main point of this invention consists in that in order to reduce the light emitting spot interval of two semiconductor laser chips, they are located so that the electrodes, which are closer to the active regions of the semiconductor laser chips, are opposite to each other. This invention however is not restricted by the constituting parts, the specification, the fabrication method, etc. described above. Thus it is possible to modify the specification of the semiconductor laser chips and other peripheral parts, depending on use of the semiconductor laser device. In this embodiment the two surfaces, on which a pair of semiconductor laser chips are separately mounted, are not necessarily two parallel planes and according to circumstances it may be possible that the semiconductor laser chips are fixed to two planes which are inclined to each other, or to two curved surfaces, depending on the specification of the optical system following the semiconductor laser device. Furthermore, the mounting position of the semiconductor laser chips can be selected arbitrarily. Although the block used in this embodiment is U-shaped, a block shape having another structure, e.g. a structure consisting of two rectangular pillar shaped blocks, may be used for certain reasons in the mounting process or mounting devices. Although, in this embodiment, a laser chip having an oscillation wavelength of 780 nm and low noise characteristics and a laser chip having an oscillation wavelength of 830 nm and a high output power are used as the two semiconductor laser chips, these characteristics may be combined arbitrarily. Depending on the object, the characteristics of the wavelength, the output and the noise may be same for the two semiconductor laser chips. Furthermore the light emission distribution may be different for the two laser chips. Of course this invention can be applied not only to write once type or magneto-optic type optical disks but also to phase-change type reversible optical disks using one of the semiconductor laser chips for rapid cooling recording and the other for slow cooling erasing. Concerning the photodiode it is possible to separate spatially the two laser beams, using a shield plate, etc. and to monitor independently the outputs of the two laser chips. Further use of this invention is not restricted to optical disks, but this invention can be utilized for multiple wavelength optical communication, if the light emitting spot interval is further reduced in a construction similar to this embodiment and the lens is replaced by another one having a smaller focal length. Furthermore it is a matter of course that the effect of this invention can be sufficiently exhibited, if light emitting elements such as edge emission type light emitting diodes, etc., a combination of a semiconductor laser and a photodiode, or optoelectronic integrated circuits (abbreviated to OEIC), in which driving circuits therefore are integrated, are used instead of the semiconductor laser chips.

Figure 4:
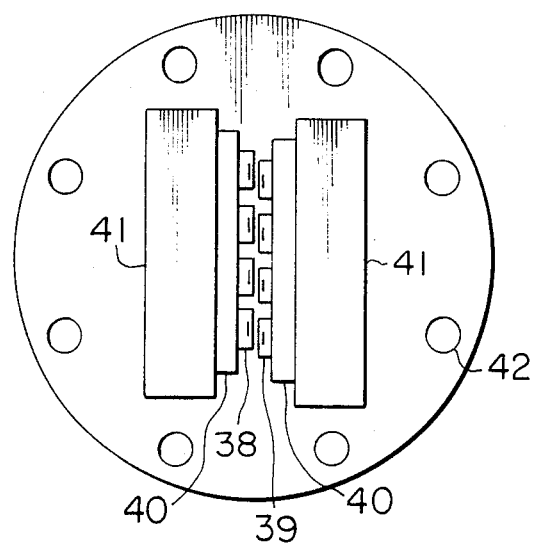
FIG. 4 is a plan view illustrating a second embodiment of this invention.

A second embodiment indicated in FIG. 4 explains a semiconductor laser device for optical disk parallel transmission, which is constructed so that 4 devices according to the first embodiment are juxtaposed. Eight semiconductor laser chips 38 and 39 are mounted on two blocks 41 through two submounts 40. Electrically the 8 semiconductor laser chips 38, 39 are connected with 8 terminals 42 through partial metallized surfaces (not shown in the figure) on the submount 40 and 8 wires, respectively, so that they can be modulated independently. Four laser chips 38 belonging to a same row are low noise lasers having an oscillation wavelength of 780 nm and the other 4 laser chips 39 belonging to the other row are high output lasers having an oscillation wavelength of 830 nm. A laser chip 38 and a laser chip 39, which are opposite to each other, are combined with each other so as to form 4 pairs of laser chips. Considering a pair of laser chips, they are fixed separately on 2 surfaces, which are opposite to each other at an interval of a space so that the electrode surfaces thereof are opposite to each other. A pair of semiconductor laser chips, which are opposite to each other, effect real time recording/reproduction of optical disks just as in the first embodiment. Adjacent laser chips having the same oscillation wavelength track different positions on the optical disk. Further each of the laser chips are located, of course, taking the chromatic aberration and the track pitch of the optical disk into account. It is for the purpose of regulating the tracking position that the row of the laser chips 38 and the row of the laser chips 39 are obliquely deviated from each other.

According to this embodiment, since it is possible to record/reproduce 4 tracks of an optical disk simultaneously and to effect 4 parallel transmissions, an effect can be obtained that the transmission speed is multiplied by 4. Further it is matter of course that the transmission speed is further increased, if the number of laser chips is increased.

Figure 5:
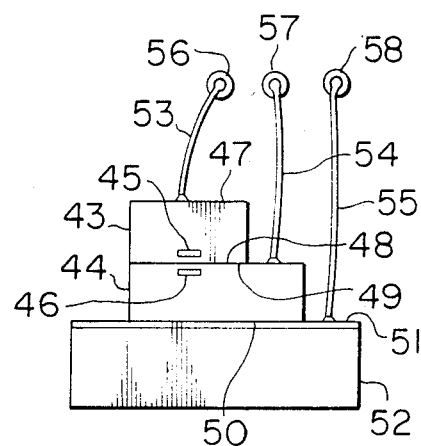
FIG. 5 is a side view illustrating a third embodiment of this invention.

In a semiconductor laser device, which is a third embodiment indicated in FIG. 5, electrode surfaces 48 and 49, which are close to active regions 45 and 46, respectively, are joined with each other so that 2 semiconductor laser chips 43 and 44 are integrated in one body. An electrode surface 50 is soldered with a metallized surface 51 on the upper surface of a mount 52. Electrode surfaces 47, 49 and the metallized surface 51 are connected electrically with terminals 56, 57, 58 through wires 53, 54, 55, respectively. The laser chips 43 and 44 can be modulated independently by grounding the terminal 57. According to this embodiment it is possible to transmit information of 2 bits by using 4 states, i.e. simultaneous oscillation state of the semiconductor laser chips 43 and 44, oscillation state of 43, oscillation state of 44, and non-oscillation state. Thus this device can be used e.g. for optical communication. Further, if the oscillation wavelengths of the semiconductor laser chips 43 and 44 differ from each other, it can be applied to the multiple wavelength optical communication. In addition, if they are oscillated simultaneously, one device can emit a light output which is twice as high as that of a prior art device and therefore it can be used with high efficiency as a high output semiconductor laser device.

Figure 6:
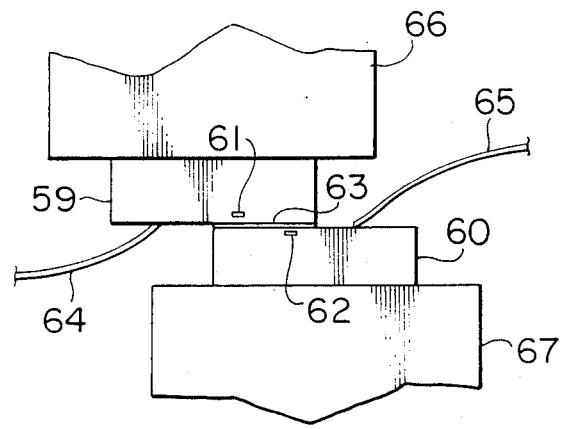
FIG. 6 is a plan view illustrating a fourth embodiment of this invention.

A fourth embodiment indicated in FIG. 6 is a semiconductor laser device for a laser beam printer. Semiconductor laser chips 59 and 60 mounted on mounts 66 and 67, respectively, are jointed through an insulating layer 63. Both the semiconductor laser chips 59 and 60 are high output lasers made of AlGaAs having an oscillation wavelength of 830 nm. The insulating layer 63 described above is made of an electrically insulating material having a low thermal conductivity. Further the laser chips 59 and 60 are not symmetric left and right in the figure and active regions 61 and 62 are deviated from the center. This is because at the chip formation of the lasers 59 and 60 cutting is intentionally deviated to such a degree that no deformation deterioration is produced in the active regions 61 and 62. In this way wires 64 and 65 for electrical wiring can be bonded more easily.

According to this embodiment it is possible to obtain a light emitting spot interval, which was impossible to realize by a prior art semiconductor laser device. That is, the interval between the active regions 61 and 62 in the longitudinal direction in the figure could be reduced to about 10 $\mu$m and the interval in the transversal direction to about 50 $\mu$m. By means of this device it is possible to effect printing of 2 lines by one sweep by sweeping the laser beams in the transversal direction in the figure while modulating independently the laser chips 59 and 60. In this way the printing speed is multiplied by a factor of 2 with respect to a prior art 1-laser-beam printer. Further, since the light emitting spot interval is sufficiently small, the size of the scanning optical system relating to this device is almost identical to that of the 1-laser-beam device. Therefore the device can be made lighter and smaller.

In this device, since the two laser chips 59 and 60 are jointed through the insulating layer 63 and the active regions 61 and 62, which are heat sources, are separated by about 50 $\mu$m, the laser chips 61 and 62 interfere with each other neither thermally nor electrically. However, since the active regions are separated by 50 $\mu$m, it is necessary to synchronize the modulation of the two laser chips 59 and 60 at printing. For this reason a photodiode is used for the control system. When the two scanning beams pass through the light receiving surface of the photodiode described above, this gives rise to 2 electric pulses. Since the time difference between the 2 electric pulses corresponds to the interval between the active regions 59 and 60 in the lateral direction in the figure, it is possible to synchronize the modulation of the laser chips 59 and 60 by regulating it so that the deviation of the timing thereof corresponds to this time difference.

Furthermore it is a matter of course that the speed of the laser beam printer can be further increased by disposing a multiplicity of devices according to this embodiment. In addition this embodiment can be applied not only to the laser beam printer but also to optical information processing devices for optical disks, optical communication, etc.

Next a fifth embodiment of this invention will be explained, referring to FIGS. 7, 8 and 9.

In the fifth embodiment a semiconductor laser device is identical to that described in the first embodiment in that 2 semiconductor laser chips are disposed so that their electrode surfaces are opposite to each other. However the package structure of the semiconductor laser device is somewhat different and it is so constructed that it is easier to position and mount the 2 semiconductor laser chips with a higher precision with respect to the first embodiment. The device according to this fifth embodiment is used e.g. for real time erasing, recording and reproduction in a rewritable optical disk device.

Figure 8:
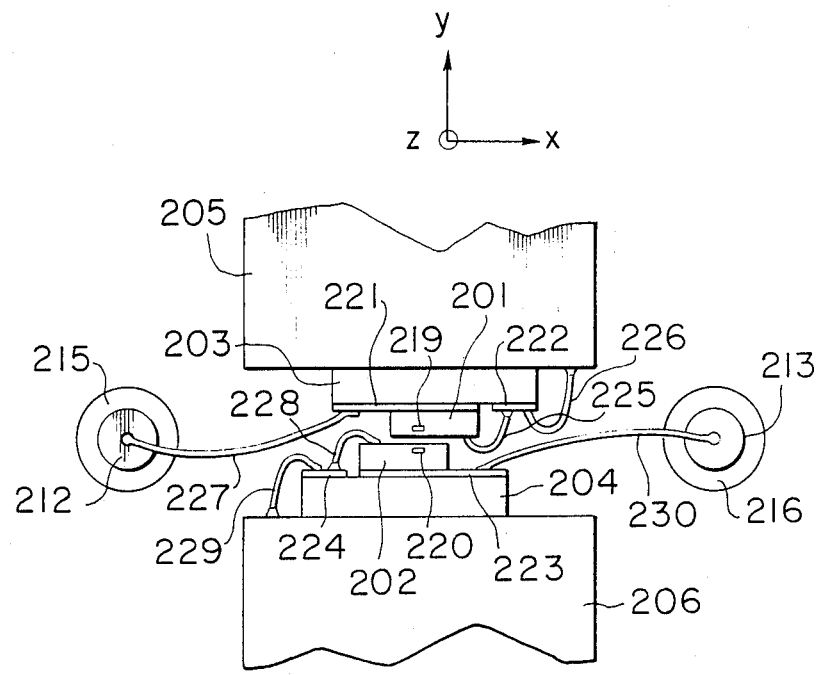
FIG. 8 is a plan view of an enlarged central portion of the fifth embodiment.
Figure 7:
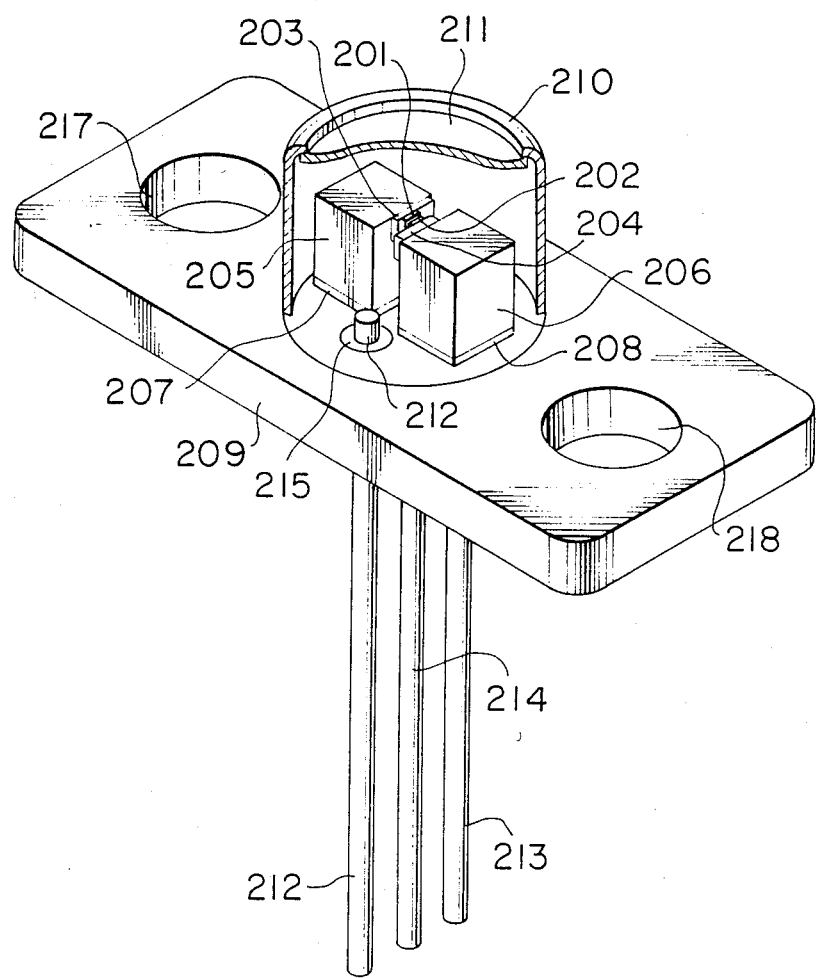
FIG. 7 is a perspective view partly cut away, illustrating a fifth embodiment of this invention.

FIG. 7 is a perspective view of the whole semiconductor laser device according to this fifth embodiment and FIG. 8 is a front view of the central portion thereof. FIG. 9 is a scheme illustrating a mounting device for this semiconductor laser device.

In FIGS. 7 and 8 laser chips 201 and 202 are mounted on blocks 205 and 206 through submounts 203 and 204, respectively. The blocks 205 and 206 are secured to a base plate 209 by solders 207 and 208. Terminals 212 and 213 are joined hermetically to the base plate 209 through glass seals 215 and 216, respectively, and electrically isolated from the base plate 209. A terminal 214 is a ground terminal welded to the base plate 209. Holes 217 and 218 formed in the base plate 209 are threaded holes for mounting this semiconductor laser device. The main portion consisting of the laser chips 201 and 202, the submounts 203 and 204, and the blocks 205 and 206 are sealed hermetically by the cap 210 and a window 211.

The laser chip 201 is a semiconductor laser chip made of AlGaAs for recording and erasing, having an oscillation wavelength of 830 nm and a high output while the laser chip 202 is a semiconductor laser chip made of AlGaAs for reproduction having an oscillation wavelength of 780 nm and low noise characteristics. The resonator for the laser chips 201 and 202 is about 300 $\mu$m long and the elements are about 100 $\mu$m thick. The laser chips are formed by cutting a chip so that active regions 219 and 220 (i.e. light emitting spots) are deviated from the center of the laser chips in order to facilitate takingout of wires 225 and 228 (FIG. 8).

The submounts 203 and 204 are made of SiC ceramics (electric insulator) and about 200 $\mu$m thick. On the submounts 203 and 204 there are disposed partially metallized portions 221, 222, 223 and 224 made of Au/Ni/Ti in order to effect electric wiring for driving the laser chips 201 and 202. Upper electrodes of the laser chips 201 and 202 are electrically connected with the blocks 205 and 206 through wires 225 and 228, the metallized portions 222 and 224, and wires 226 and 229, respectively, and grounded (terminal 214). Lower electrodes of the laser chips 201 and 202 are connected electrically to the terminals 212 and 213 through metallized portions 221 and 223, and wires 227 and 230, respectively. All the wires 225, 226, 227, 228, 229 and 230 are made of Au.

The material for the blocks 205 and 206 is Cu having a high heat conductivity for evacuating heat produced in the laser chips 201 and 202 with a high efficiency. The blocks 205 and 206 are 1.5 mm long, 1.5 mm wide and 2.0 mm high.

The base plate 209, the terminals 212, 213 and 214, and the cap 210 are made of Kovar alloy (thermal expansion coefficient $5 \times 10^{-6} °C.^{-1}$) having a thermal expansion coefficient close to that of the glass seals 215 and 216.

The window 211 is made of an optical glass transmitting the laser light beams emitted by the laser chips 201 and 202. Anti-reflection coating is applied on the surfaces of the glass in order to prevent reflection of the laser light.

The laser chips 201, 202 and the submounts 203, 204 (metallized portions 221, 223) as well as the submounts 203, 204 and the blocks 205, 206 are secured respectively by using Au-Sn solder (melting point 280° C.). Solders 207 and 208 used at positioning the laser chips 201 and 202 are Pb-Sn (melting point 183° C.) having a melting point lower than the Au-Sn solders. The blocks 205 and 206 and the base plate 209 are plated by using Au/Ni in order to improve the wettability thereof with respect to the solder.

The mounting specifications concerning the relative positions of the active regions 219 and 220 of the laser chips 201 and 202, i.e. the relative positions of the light emitting spots are that $x=0 \pm 1$ $\mu$m, $y=25 \pm 1$ $\mu$m and $z=22 \pm 2$ $\mu$m in the directions along the x-, y- and z-axes (FIG. 8). These mounting specifications are determined by requirements for the optical system. It is for the purpose of correcting the chromatic aberration of the optical system described above that the end surface of the laser chip 202 is higher by 22 $\mu$m than the end surface of the laser chip 201 in the direction of the z-axis. The specifications shown here may be modified, depending on the method, by which the semiconductor laser device is used.

Figure 9:
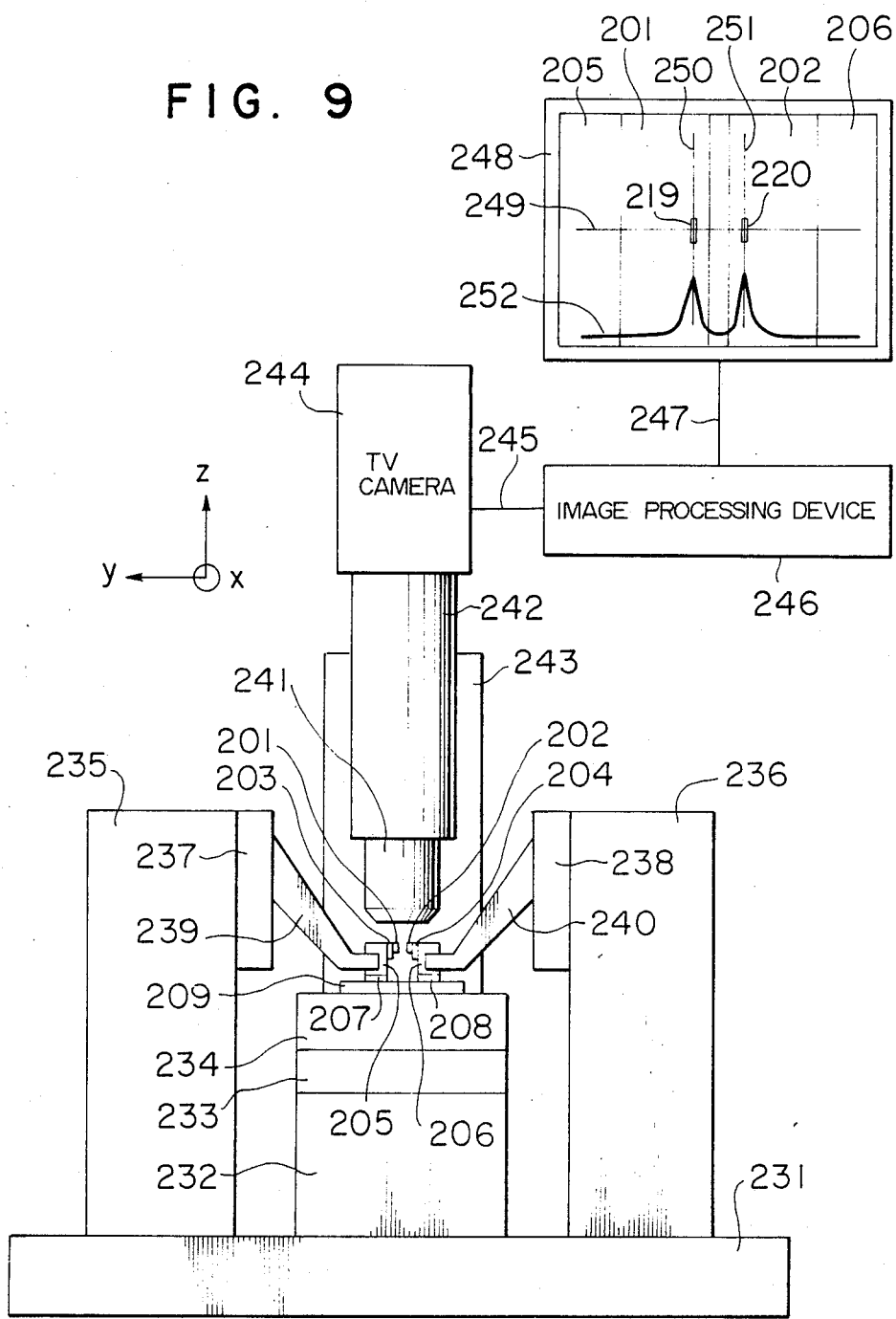
FIG. 9 is a scheme showing the construction of a mounting device used for the fifth embodiment.

FIG. 9 is a scheme illustrating the construction of a mounting device for the semiconductor laser device, which is the fifth embodiment of this invention. This mounting device is destined to position and fix finally the semiconductor laser device of these specifications. The semiconductor laser device is mounted on a heater 234 of the mounting device in a state, where it is provisionally mounted at its approximate position, and dismounted from the mounting device, after having regulated it so as to satisfy the specifications.

Hereinbelow the mounting device will be explained. A sample table 232, fine adjustment devices 235 and 236 and a supporter 243 are fixed rigidly to a vibration suppressing table 231. The heater 234, on which the semiconductor laser device is mounted, is secured to the sample table 232 through a heat insulating plate 233. Mechanisms 239 and 240 are tools for holding the blocks 205 and 206 of the semiconductor laser devices by chucking them. The mechanisms 239 and 240 are mounted on the fine adjustment tables 235 and 236 through heat insulating plates 237 and 238, respectively. The state of the semiconductor device can be enlarged and observed by means of a TV camera 244. The front of the semiconductor laser device is image on the screen of the TV camera 244 through an objective lens 241 and a body tube 242. The image taken by the TV camera 244 is sent to an image processing device 246 through a wire 245 and imaged on a TV monitor 248 through a wire 247. The body tube 242 is mounted on the supporter 243.

Now the mounting device will be explained in detail. Since the vibration suppressing table 231 is robust and has a high rigidity and excellent vibration suppressing characteristics, it is suitable for mounting with a high precision of submicron order.

A temperature regulating device (not shown in the figure) is connected with the heater 234 and can hold stably the set temperature within a region of errors of $\pm 1°$ C. When the solders 207 and 208 are melted, the temperature is set at 220° C. and when the solders 207 and 208 are solidified, it is set at 170° C. The real temperature of the upper surface of the heater 234 is displayed on the temperature regulating device. Since the heater 234 is made of Super-Invar alloy having a small thermal expansion coefficient ($<1 \times 10^{-6} °C.^{-1}$), thermal displacements of the heater 234 due to temperature variations (50° C. $= 220° - 170°$ C.) could be held to be below $\pm 1$ $\mu$m. Further it was prevented by using a heat insulating plate 233 that heat produced by the heater was conducted to the sample table 232 and the position of the sample table 232 was varied by thermal expansion. Consequently the position of the base plate 209 can be satisfactorily controlled at the mounting. The heat insulating plate 233 is made of heat insulating ceramics having a low thermal expansion coefficient (thermal expansion coefficient $-1.3 \times 10^{-6} °C.^{-1}$). In order to prevent oxidation of the solders 207 and 208, they were surrounded by an $N_2$ atmosphere.

The heater 234 is provided with a mechanism (not shown in the figure) for holding the base plate 209 so that the semiconductor laser device can be mounted thereon. Further it is provided with a socket (not shown in the figure), in which the terminals 212, 213 and 214 are inserted. The socket is connected electrically with a pulse generator (not shown in the figure), in the power source for driving the laser chips 201 and 202.

The sample table 232 can be coarsely and finely adjusted in the directions of the x-, y- and z-axes. The position of the whole semiconductor laser device mounted on the heater 234 can be moved by means of this sample table 232.

The mechanisms 239 and 240 are made of Super-Invar alloy having a low thermal expansion coefficient. Thermal displacements of the mechanisms 239 and 240 due to temperature variations (50° C.) of the heater 234 are kept below $\pm 0.5$ μm. In this way it is possible to control satisfactorily the position of the blocks 205 and 206, i.e. the laser chips 201 and 202, at the mounting. When the mechanisms 239 and 240 grasp the blocks 205 and 206, opening and shutting of the chuck are effected by an electromagnetic magnet. The extremities of the mechanisms 239 and 240 are worked in accordance with the shape of the blocks 205 and 206 so that they can easily hold the blocks 205 and 206. The heat insulating plates 237 and 238 are used in order not to transfer heat produced by the heater 234 to the fine adjustment devices 235 and 236, respectively. The heat insulating plates 237 and 238 are made of the same heat insulating ceramics as the heat insulating plate 233, having a low thermal expansion coefficient.

The fine adjustment tables 235 and 236 can effect fine adjustment of $\pm 0.1$ μm with respect to the x-, y- and z-axes and $\pm 0.1°$ with respect to the $\theta_x$-, $\theta_y$- and $\theta_z$- axes by means of a high precision fine displacement mechanism and a piezo element. By moving the fine adjustment tables 235 and 236 it is possible to displace the position of the blocks 205 and 206 held by the mechanisms 239 and 240 so as to regulate the position of the active regions 219 and 220 of the laser chips 201 and 202 in accordance with the specifications described above.

The mechanism 239, the heat insulating plate 237 and the fine adjustment table 235 on one side and the mechanism 240, the heat insulating plate 238 and the fine adjustment table 236 on the other side are formed so as to be symmetric left and right. In this way thermal displacements due to temperature variations (50° C.), i.e. positional variations of the blocks 205 and 206 are produced symmetriclly left and right. Since it is sufficient that the positional relation between the active regions 219 and 220 of the laser chips 201 and 202 is relatively satisfied, positional variations arising symmetrically left and right give rise to no serious problems at the mounting.

The positioning of the active regions 219 and 220 is effected while driving the laser chips 201 and 202 by means of pulse generators (not shown in the figure) in the state where the solders 207 and 208 are molten and confirming the position of the active regions 219 and 220 (light emitting spots) by observing the image on the screen of the TV monitor 248. The focusing of the image is regulated by adjusting a fine adjustment mechanism (disposed behind the body tube 242 and therefore not seen) located between the body tube 242 and the supporter 243.

The magnification factor of the objective lens 241 is selected, taking the resolving power of the TV camera 244 and the TV monitor 248 as well as the depth of focus of the objective lens 241 into account. In this embodiment an objective lens having a magnification factor of 40 and a depth of focus of 0.7 μm was used. For the TV camera 244 a silicon vision camera was used, which has a high sensitivity for the oscillation wavelengths of 830 and 780 nm of the laser chips 201 and 202.

The image processing device 246 is used for emphasizing parts, where the light intensity is high, in order to have a good contrast in the image. In this way it was made easier to discern the positions of the active regions 219 and 220, i.e. the positions of the light emitting spots. Further reference lines 249, 250 and 251 for positioning are indicated on the screen by the image processing device 246. The positions of the reference lines 249, 250 and 251 have been previously calibrated with respect to the real size. The interval between the reference lines 250 and 251 on the screen corresponds to 25 μm in the real size. The limit of the resolving power in the real position corresponding to the resolving power on the screen is 0.2 μm. The light intensity distribution 252 on the reference line 249 is also displayed on the screen.

In the above the mounting device has been explained, referring to FIG. 9.

Now the fabrication steps for mounting the semiconductor laser device of the fifth embodiment will be explained below.

A. Provisional mounting step

Before the mounting is effected by means of the mounting device indicated in FIG. 9, the semiconductor laser device is provisionally mounted. At the provisional mounting the semiconductor laser device indicated in FIG. 7 is mounted except for only the cap 210 and the window 211. The laser chips 201 and 202, the submounts 203 and 204, the blocks 205 and 206, etc. are fixed to each other the blocks 205 and 206 are fixed to the base plate 209 by using the solders 207 and 208, respectively. At this time the active regions 219 and 220 are located in the neighborhood of their predetermined positions (approximately $x=0\pm 10$ μm, $y=25\pm 10$ μm and $z=0 \pm 10$ μm). Further electrical wiring (wires 225, 226, 227, 228, 229 and 230) is also effected.

B. Loading step

The provisionally mounted semiconductor laser device is loaded on the heater 234. That is, the terminals 212, 213 and 214 are inserted in the socket stated above and the base plate 209 is held.

C. Block holding step

The whole semiconductor laser device loaded on the heater 234 by the preceding step is moved to the proper position by moving the sample table 232. The electromagnetic chucks of the mechanisms 239 and 240 are shut so as to hold separately the blocks 205 and 206, after having displaced the mechanisms 239 and 240 to their proper positions by using the fine adjustment tables 235 and 236. At this time it is verified that the blocks 205 and 206 are held rigidly.

D. Focusing step

The focusing is regulated by moving the body tube 242 up or down so that both the laser chips 201 and 202 are almost imaged on the screen of the TV monitor 248. It is because the heights of the end surfaces of the laser chips 201 and 202 (in the direction of the z-axis) fluctuate by about ±10 μm in the provisionally mounted state that it is said they are almost imaged. Since the depth of focus of the objective lens 241 is 0.7 μm, both the laser chips 201 and 202 are not imaged clearly simultaneously. At the same time as the focusing regulation the contrast, the brightness, etc. of the image are regulated.

E. Solder melting step

The temperature setting of the temperature regulating device for the heater 234 is raised to 220° C. The solders 207 and 208 melt almost as soon as the indicated temperature of the heater 234 exceeds 183° C. It can be verified either by observing the brilliance of the surfaces of the solders 207 and 208 or by examining whether the blocks 205 and 206 move freely when the fine adjustment table 235 and 236 are slightly moved that the solders 207 and 208 are molten.

F. Laser driving step

The laser chips 201 and 202 are pulse-driven by making current flow between the terminals 212 and 214 as well as the terminals 213 and 214 by means of the pulse generator. Since the centers of the active regions 219 and 220 emit light strongly, their positions can be detected on the screen of the TV monitor 248. It is because the temperature of the laser chips 201 and 202 is raised to about 200° C. and therefore it is impossible to oscillate them continuously that they are pulse-driven.

G. Laser chip positioning step

By operating separately the fine adjustment tables 235 and 236 the active regions 219 and 220 are relatively located at their predetermined positions. The operation is effected in the directions of the x-, y-, z-, $\theta_x$, $\theta_y$- and $\theta_z$-axes for every fine adjustment table. At first focusing is effected correctly for the image of the active regions 219 and 220 by finely adjusting them in the direction of the z-axis (Vertical direction on the screen) (the light emitting spots are smallest at this time). Then positional regulation is effected so that the active regions 219 and 220 are located on the intersections of the reference lines 250, 251 and 249 with the reference lines 249 on the screen and that the 2 peak intensities in the light intensity distribution 252 are maximum. Next, taking the chromatic aberration, etc. of the objective lens 241 and the body tube 242 into account, the laser chips 201 and 202 are positioned in the direction of the z-axis. In this embodiment, leaving the laser chip 201 as it is, the laser chip 202 was displaced upward (direction of +z-axis). In the case where the laser chips 201 and 202 have astigmatic aberrations (directions of x- and y-axes), it is supposed that the center position of the astigmatic difference of the laser chips is the focusing point in the direction of the z-axis on the screen.

H. Solder solidifying step

The temperature setting of the temperature regulating device for the heater 234 is lowered to 170° C. Since the melting point of the solders 207 and 208 is 183° C., the molten solders 207 and 208 are solidified and the blocks 205 and 206 are fixed to the base plate 209. As explained, referring to FIG. 9, thermal displacements of the mechanisms 239 and 240 the sample table 232, etc. in the neighborhood of the heater 234 are kept in a tolerance region indicated in the specification of the semiconductor laser device. Consequently even if the temperature of the heater 234 is lowered by 50° C., the relative positions of the laser chips 201 and 202 (blocks 205 and 206) rest to be controlled satisfactorily and they are never deviated from the predetermined positions. Further volume constraction of the solders 207 and 208 is produced at the same time as the thermal deviations, but it gives rise to no problem, because the relative positions of the laser chips 201 and 202 (blocks 205 and 206) are maintained to the predetermined positions by the mechanisms 239 and 240. In this way, in the stage where the solders 207 and 208 have been solidified, the relative positions of the laser chips 201 and 202 are determined with a sufficient precision satisfying the specification. Although it was not effected in this embodiment, in the case where a mounting with a higher precision is necessary, it is also possible that thermal displacements of the mechanisms 239 and 240, the heater 234, the blocks 205 and 206, etc. and variations in volume of the solders 207 and 208 are previously evaluated and the blocks 205 and 206 are set, offsetting their positions by the amounts thus obtained.

I. Laser stopping step

When the solders 207 and 208 have been completely solidified, the current in the pulse generator is reduced to 0 and the emmisions of the laser chips 1 and 2 are stopped.

J. Mechanism dismounting step

The mechanisms 239 and 240 are dismounted from the blocks 205 and 206 having held them separately. At this time attention should be paid not to apply excessive external force to the blocks 205 and 206.

K. Dismounting step

The semiconductor laser device, for which the final positioning and the solidification have been already completed, is dismounted from the grasping mechanism of the heater 234.

L. Cooling step

Since the temperature of the semiconductor laser device is still at about 170° C., it is cooled to the room temperature. At this time thermal contraction is produced in the blocks 205 and 206, but since the size of the blocks 205 and 206 themselves is small, their contraction is also small and gives rise to no problem concerning the relative position of the laser chips 201 and 202. If a mounting precision, which is still higher, is required, this contraction may be previously evaluated and the laser chips 201 and 202 may be set, offsetting their positions by the amounts thus obtained in the laser positioning step.

M. Cap mounting step

The cap 210 provided with the window 211 is welded to the base plate 209 in an $N_2$ atmosphere by means of a device (not shown in the figure) other than the mounting device indicated in FIG. 9. The main portion consisting of the laser chips 201 and 202, the submount 203 and 204, the blocks 205 and 206, etc. are hermetically sealed.

N. Completion

The semiconductor laser device according to the fifth embodiment is completed by the steps described above.

One thousand semiconductor laser devices of the fifth embodiment have been fabricated in practice according to the fabrication steps described above. The light emitting spots of the laser chips 201 and 202 were examined and it was found that on the average x=0.0±0.2 μm, y=25.0 ±0.8 μm and z=22.0±0.9 μm and that all the values of x, y and z satisfy the specification.

In this fifth embodiment it is for the reasons described below that it was possible to effect positioning and mounting with a high precision of submicron order as described above. Firstly, since the different parts in the mounting device indicated in FIG. 9 are made of materials having low thermal expansion coefficients, thermal displacements due to temperature variations of the heater 234 can be suppressed to low values. Secondly, as understood from FIG. 9, the mounting device has a symmetric structure. Since thermal deviations are produced symmetrically with respect to each of the axes, the relative position of the laser chips 201 and 202 is maintained Thirdly the blocks 205 and 206 are held separately by the mechanisms 239 and 240, respectively. From the point of view of the structure of the semiconductor laser device, the solder layers 207 and 208 are disposed on the blocks 205 and 206. In this way, also during the solidification of the solders 207 and 208 after the positioning of the laser chips 201 and 202 the relative positional relationship between the laser chips 201 and 202 is maintained. Consequently no positional deviations are produced.

As explained above, since positioning and fixation can be effected with a high precision by simple operations, using the semiconductor laser device and the mounting device therefor indicated in this fifth embodiment, an effect can be obtained that the productivity of semiconductor laser devices is increased. That is, according to this fifth embodiment, semiconductor laser devices having high added values can be realized easily in practice. Reduction of the size, increase of the speed and multiplication of functions of the optical system not only in optical disk devices but also in optical application apparatus such as laser beam printers, optical information processing devices such as optical computers, optical communication apparatuses for optical multiple communication, etc. can be realized and therefore this invention can give the optical industry far-reaching effects.

Figure 10:
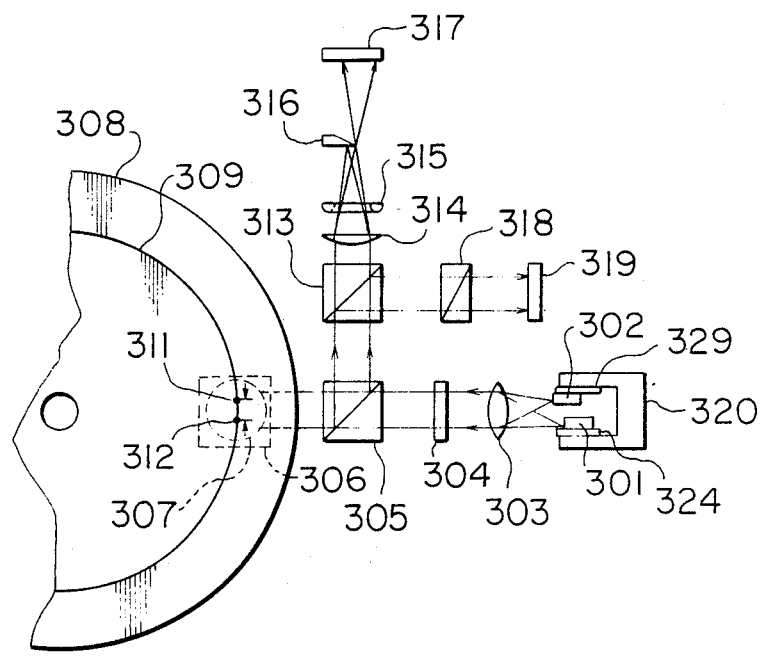
FIG. 10 is a scheme showing the construction of an optical head using a magneto-optic disk, which is another embodiment of this invention.
Figure 11:
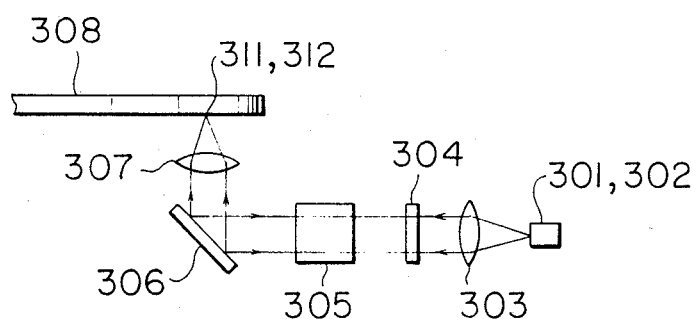
FIG. 11 is a side view of the optical head indicated in FIG. 10.

Now another embodiment, in which this invention is applied to an optical head in a magneto-optic disk device, will be explained. FIG. 10 is a plan view illustrating the construction of the optical system for an optical head and FIG. 11 is a side view thereof. A semiconductor laser chip 301 having a wavelength of 830 nm and an output of 30 mW emits a laser beam for recording. On the other hand, a semiconductor laser chip 302 having a wavelength of 780 nm, a low output and low noise characteristics emits a laser beam for reproduction. The two laser beams are transformed into parallel beams by a collimating lens 303. They pass through a half wave plate 304 and a beam splitter 305. Then they are reflected by a mirror 306 and focused as a spot 311 for recording and a spot 312 for reproduction, respectively, on a track 309 of a magneto-optic disk 308 by a focusing lens 307. Reflected beams coming from the two spots 311 and 312 are transformed again into parallel beams by the focusing lens 307, reflected by the mirror 306, reflected by the beam splitter 305, and enter a wavelength separating prism 313. The wavelength separating prism 313 is one which transmits the beam of a wavelength of 830 nm and reflects the beam of a wavelength of 780 nm. Therefore the beam for recording of the wavelength of 830 nm passes through the wavelength separating prism 313 and is led to a focusing deviation detecting and track deviation detecting optical system consisting of a convex lens 314, a cylindrical lens 315, a knife edge 316 and a division type photodetector 317. The principle of the focusing deviation detection and that of the track deviation detection by this detecting optical system are disclosed in detail in JP-A-57-10811. On the other hand the beam for reproduction having the wavelength of 780 nm is reflected by the wavelength separating prism 313 and led to an analyzer type magneto-optic signal detecting optical system consisting of an analyzer 318 and a photodetector 319.

Figure 12:
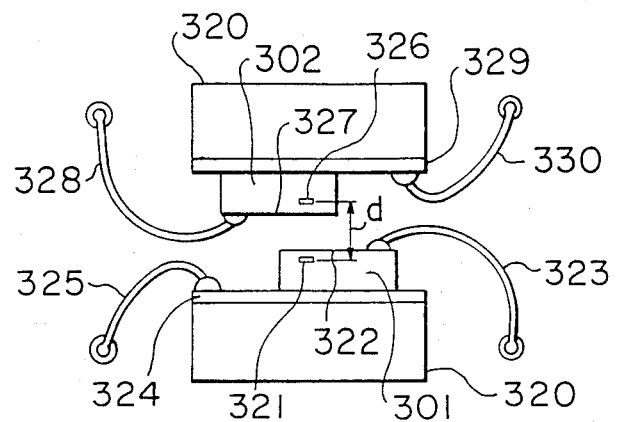
FIG. 12 is a plan view illustrating a semiconductor laser device used for the optical head indicated in FIG. 10.

The two semiconductor laser chips 301 and 302 are mounted on a mount 320 through submounts 324 and 329, respectively, made of SiC ceramics. FIG. 12 is a scheme illustrating the mounting state of the two semiconductor laser chips 301 and 302, seen from the collimating lens 303 side. On the surfaces of the submounts 324 and 329 there are formed pattern electrodes, which are connected with lead wires 325 and 330, respectively. Electrode surfaces 322 and 327 of the laser chips 301 and 302 are connected with lead wires 323 and 328, respectively. The interval between the electrode surfaces 322 and 327 is 17 μm. Laser lights are emitted by active regions 321 and 326, respectively. The distance between the active region 321 and the electrode surface 322 is about 5 μm and the distance between the active region 326 and the electrode surface 327 is also about 5 μm. Consequently the interval d between light emitting spots of the two semiconductor laser chips is 27 μm. The numerical aperture $NA_c$ of the collimating lens 302 is 0.2 and the numerical aperture $NA_f$ of the focusing lens 307 is 0.53. Further the interval l between the spot 311 for recording and the spot 312 for reproduction on the disk is 10 μm.

Figure 13:
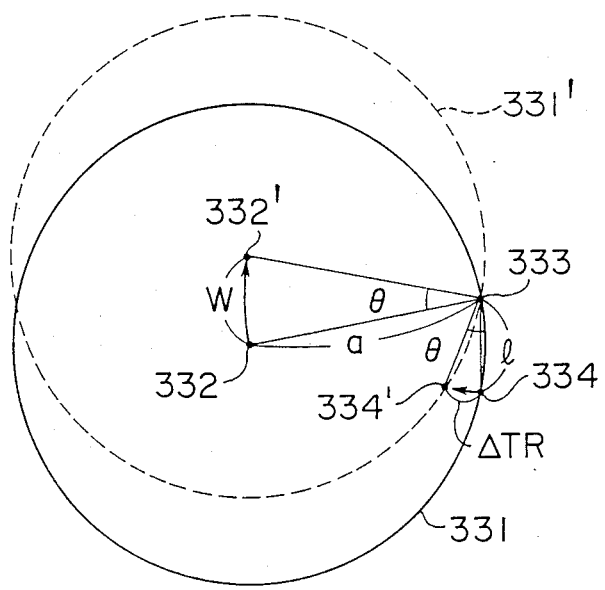
FIG. 13 is a scheme for explaining a problem on track deviation.

The track 309 on the optical disk 308 is made eccentric by rotation. The eccentricity of the track is usually at greatest about 100 μm. For this reason, for a 2-beam optical head track deviations are produced. This will be explained below, referring to FIG. 13. A circle 331 represents a track having a radius a, whose center is at a point 332. The two spots 333 and 334 are apart by l from each other and on the track represented by the circle 331. Now consider the case where the track is eccentric. For example, suppose that the track is rotated by θ from the position of the circle 331 to the position of a circle 331' indicated by a broken line around the spot 333 as the center. The center of the eccentric track is indicated by a point 332'. Further the point on the track where the spot 334 was located, which is on the new circle indicated by the broken line, is indicated by a point 334'. The distance between the point 332 and the point 332' is the amount of eccentricity W of the track and the distance between the point 334 and the point 334' is the amount of deviation ΔTR of the track. Since the following formulas are approximately valid:

$$W \simeq a \cdot \theta$$

$$\Delta TR \approx l \cdot \theta$$

The amount of deviation $\Delta TR$ produced by the amount of eccentricity W can be given as follows;

$$\Delta TR \approx \frac{l \cdot W}{a}$$

For example, since the radius of the innermost track of an optical disk having a diameter of 90 mm is about 30 mm, supposing that $l=40$ μm, $W=100$ μm and $a=30$ mm, using the formula described above, $$\Delta TR \approx 0.133 \text{ μm}$$

However, by the pit center recording method, by which the center position of a recording pit corresponds to "1" of 2-valued recorded data, the tolerance of the track deviation is usually smaller than 0.13 μm. When the track deviation exceeds 0.13 μm, the error rate increases at the reproduction, which is not practical, because of decrease in the reproduced signal and increase in the cross talk due to pits recorded on an adjacent track. In order to keep track deviations below 0.13 μm, it is necessary to keep the interval between the two spots below 40 μm.

Further, by the pit edge recording method, by which the positions of the edges of a recorded pit correspond to "1" of 2-valued recorded data, the recording density is doubled, but the tolerance of the track deviation is reduced to about 0.07 μm, which is about a half of that for the pit center recording method. When the track deviation exceeds 0.07 μm, the phase deviation of the reproduced signal increases and the error rate increases at the reproduction which is not practical. In order to keep track deviations below 0.07 μm, it is necessary to keep the interval between the two spots below about 20 μm.

For this reason the optical head according to this embodiment can be used both for a magneto-optic disk according to the pit center recording method and for a magneto-optic disk according to the pit edge recording method.

In order to reduce the thickness of the optical head, it is desirable to arrange optical parts on a plane, as indicated in FIG. 10. It is preferable that the beam splitted by the beam splitter 305 or the wavelength separating prism 313 is also included in this plane. From the point of view of the light utilization efficiency and the signal detection efficiency a beam splitter 305 having e.g. characteristics that the P polarized light transmission coefficient is about 70% and the S polarized light reflection coefficient is about 100%, is used, and the optical system is so constructed that the beam reflected by the disk is reflected further by the beam splitter 305 and led to the detecting optical system. That is, the beams emitted by the semiconductor laser chips 301 and 302 are P polarized and injected to the beam splitter 305. In this way it is possible to obtain a high light utilization coefficient with a transmission coefficient of 70%. At the same time the S polarized component, which is a magnetooptic signal component included in the beam reflected by the disk, can be reflected with a high efficiency and reach the detecting optical system. However, in the case where the two laser chips 301 and 302 are opposite to each other, the linear polarization direction of the laser lights emitted by the two laser chips 301 and 302 is the direction perpendicular to the sheet of FIG. 10. This is the S polarization direction of the beam splitter 305. In this case the half wave plate 304 is disposed between the laser chips 301, 302 and the beam splitter 305 so that the linear polarization direction of the 2 laser beams is rotated by 90° so as to be P polarized. Instead of the half wave plate e.g. a Faraday element may be used.

As in this embodiment, when laser chips having different wavelengths are used, it is possible to separate two beams in a simple manner by using the wavelength separation prism 313. On the other hand, the collimating lens 303 and the focusing lens 307 have chromatic aberations. Therefore, when the emitting end surface of the laser chip 301 and the emitting end surface of the laser chip 302 are arranged on a common plane, the focusing points of the two spots 311 and 312 are deviated from each other. For example the chromatic aberration of the whole lens system used in this embodiment, in which the collimating lens 303 is combined with the focusing lens 307, is 0.038 μm/nm and the deviation due to a wavelength difference of 50 nm is 1.9 μm. Therefore, in order to compensate it, the laser chip 302 having a wavelength of 780 nm is deviated by about 13 μm towards the collimating lens 303 along the optical axis with respect to the laser chip 301 having a wavelength of 830 nm.

This invention can be applied not only to the embodiment described above but also e.g. to phase transition type optical disk devices and write once type optical disk devices as well as optical card devices.

In this way it is possible to reduce the interval between the spots on the optical disk surface to a value of 4 μm at smallest and to realize a 2-beam optical head sufficiently practical, by which track deviations produced by the eccentricity of the disk are small. Furthermore the separation of the two beams can be effected easily by means of only one optical element and in addition a thin 2 beam optical head can be realized.

As explained above, by using the semiconductor laser device according to this invention, it is possible to mount a plurality of semiconductor chips having different characteristics, owing to the fact that at least a pair of laser chips are separately secured to two surfaces, which are opposite to each other at an interval of a space or that at least a pair of semiconductor laser chips are so disposed that the electrode surfaces thereof are parallel and opposite to each other. In addition, since it is possible to reduce the interval of the light emitting spots of the semiconductor laser chips stated above to a value below 100 μm without thermal and electrical interference, an effect can be obtained that improves the functions of semiconductor laser devices and peripheral devices thereof. For example, optical information processing devices can be improved by a reduction of the size and increase in the speed of an optical disk device, the speed of a laser beam printer can be increased, etc.

What is claimed is:

1. A semiconductor laser device comprising:
   a first semiconductor laser chip including first and second chip surfaces which are parallel to each other, a first active layer which is located between and parallel to said first and second chip surfaces, said first active layer being positioned closer to said first chip surface than said second chip surface, and a light emitting surface;
   a second semiconductor laser chip including first and second chip surfaces which are parallel to each other, a second active layer which is located between and parallel to said first and second ship surfaces, said second active layer being positioned closer to said first chip surface than said second chip surface, and a light emitting surface;

means for exciting said first and second semiconductor laser chips;

supporting means for supporting said first and second semiconductor laser chips such that said first surface of said first semiconductor laser chip and said first surface of said second semiconductor laser chip are substantially parallel and opposite to each other.

2. A semiconductor laser device according to claim 1, wherein said supporting means includes two surfaces which are opposite to each other, each of said surfaces having a respective one of said first and second semiconductor laser chips mounted thereon.

3. A semiconductor laser device according to claim 1, wherein said first and second laser chips have different oscillation frequencies.

4. A semiconductor laser device according to claim 1, wherein said supporting means comprises at least a pair of supporters, each of said supporters having a respective one of said first and second semiconductor laser chips mounted thereon, and a base plate to which said supporters are secured.

5. A semiconductor laser device according to claim 1, wherein said first and second semiconductor laser chips are supported by said supporting means so that said light emitting surfaces thereof are shifted from each other in the direction of the emission of the laser beams.

6. A semiconductor laser device according to claim 1, further comprising a vessel containing said first and second semiconductor laser chips and said supporting means, said vessel includes means for transmitting laser beams emitted by said first and second semiconductor laser chips.

7. A semiconductor laser device according to claim 6, wherein said transmitting means comprises an optical material which is transparent to said laser beams emitted by said first and second semiconductor laser chips.

8. A semiconductor laser device according to claim 6, wherein said vessel further includes a lens for focusing said laser beams.

9. A semiconductor laser device according to claim 8, wherein the oscillation frequencies of said first and second semiconductor laser chips are different from each other, said first and second semiconductor laser chips being mounted on said supporting means so that said light emitting surfaces thereof are shifted from each other in the direction of said laser beams, thereby correcting a chromatic aberration produced by said lens.

10. A semiconductor laser device according to claim 1, wherein each of said first and second semiconductor laser chips further include a laser oscillation region disposed in each of said first and second active layers, respectively, and said first and second semiconductor laser chips include electrode wirings which are placed on each surface of said semiconductor laser chips excluding said first surfaces of said first and second semiconductor laser chips, whereby said first and second semiconductor laser chips are shifted from each other in a direction parallel with said first and second active layers so that said laser oscillation regions are also shifted with respect to each other.

11. A semiconductor laser device according to claim 1, further comprising:

means for bonding said first surface of said first semiconductor laser chip with said first surface of said second semiconductor laser chip whereby said supporting means is connected with said second surfaces of each of said first and second semiconductor laser chips.

12. An apparatus comprising:

a first semiconductor laser chip including first and second chip surfaces which are parallel to each other, a first active layer which is located between and parallel to said first and second chips surfaces, said first active layer being positioned closer to said first chip surface than said second chip surface, and a light emitting surface;

a second semiconductor laser chip including first and second chip surfaces which are parallel to each other, a second active layer which is located between and parallel to said first and second chip surfaces, said second active layer being positioned closer to said first chip surface than said second chip surface, and a light emitting surface which is separated from said light emitting surface of said first semiconductor laser chip by a distance $d_1$;

supporting means for supporting said first and second laser chips such that said first surface of said first laser chip and said first surface of said second laser chip are substantially parallel and opposite to each other;

collimating means including a first lens having a predetermined focal length $f_c$ for collimating first and second laser beams emitted from said first and second semiconductor laser chips; and focusing means including a second lens having a predetermined focal length $f_F$ for focusing said first and second laser beams, after said laser beams are collimated by said collimating means, onto an information recording medium so as to form collected light spots on said information recording medium which are separated from each other by a distance of $D_1$.

13. An apparatus according to claim 12, wherein said distance $D_1$ between said collected light spots is controlled so that $D_1 \leq 40$ μm where $D_1 = (f_F/f_c) \cdot d_1$.

14. An apparatus according to claim 13, wherein said distance $D_1$ between said collected light spots is controlled so that $D_1 \leq 20$ μm.

15. An apparatus according to claim 12, further comprising a beam splitter disposed between said first lens and said second lens for splitting said first and second laser beams which are incident upon said information recording medium and for splitting first and second laser beams reflected by said information recording medium, and polarization direction transformer means included between said beam splitter and said first lens for rotating the linear polarization direction of said reflected laser beams by 90°.

16. An apparatus according to claim 15, wherein said first and second laser beams have different frequencies and said apparatus further comprises a separation prism which carries out wavelength separation of said first and second laser beams which are reflected by said information recording medium.

17. An apparatus according to claim 16, wherein said first and second semiconductor laser chips are positioned so that said light emitting surfaces thereof are shifted from each other in the direction of the optical axes of said first and second laser beams so that said collected light spots formed on said information recording medium are prevented from being deviated from each other.

18. A semiconductor laser device according to claim 1, wherein said supporting means comprises at least a pair of supporters, each of said supporters having a respective one of said first and second semiconductor laser chips mounted and fixed thereto by a first solder, and a base plate having said supporters fixed thereto by a second solder, said first solder having a melting point higher than that of said second solder.

19. A semiconductor laser device according to claim 18, wherein said first and second semiconductor laser chips are fixed to said supporters so that an electrode surface of each of first and second said semiconductor laser chips are parallel and opposite to each other.

* * * * *